(12) United States Patent
Taylor et al.

(10) Patent No.: US 7,439,804 B2
(45) Date of Patent: Oct. 21, 2008

(54) AMPLIFIER WITH LEVEL SHIFTING FEEDBACK NETWORK

(75) Inventors: Stewart S. Taylor, Beaverton, OR (US); Brent Carlton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 79 days.

(21) Appl. No.: 11/714,369

(22) Filed: Mar. 5, 2007

(65) Prior Publication Data

US 2008/0218267 A1    Sep. 11, 2008

(51) Int. Cl.
*H03F 3/45* (2006.01)

(52) U.S. Cl. ...................... 330/259; 330/253

(58) Field of Classification Search ............ 330/253, 330/259, 260, 261
See application file for complete search history.

(56) References Cited

U.S. PATENT DOCUMENTS

| | | | | |
|---|---|---|---|---|
| 6,218,901 | B1 * | 4/2001 | Lukes et al. | 330/258 |
| 6,794,940 | B2 * | 9/2004 | Suzuki | 330/252 |
| 7,315,210 | B2 * | 1/2008 | Nguyen | 330/253 |

* cited by examiner

*Primary Examiner*—Henry K Choe
(74) *Attorney, Agent, or Firm*—Dana B. Lemoine; Lemoine Patent Services, PLLC

(57) ABSTRACT

An amplifier circuit includes a low noise first stage and a wide dynamic range second stage. A feedback network coupled between the output of the second stage and the input of the first stage provides DC level shifting of the common mode input voltage. The common mode input voltage is shifted to a value that allows the output of the first stage to be compatible with the input of the second stage.

12 Claims, 3 Drawing Sheets

US 7,439,804 B2

AMPLIFIER WITH LEVEL SHIFTING FEEDBACK NETWORK

FIELD

The present invention relates generally to amplifier circuits, and more specifically to amplifier circuits with wide dynamic range.

BACKGROUND

Amplifier circuits benefit from low noise and wide dynamic range. Low noise allows for higher sensitivity, and wide dynamic range allows for a larger output voltage swing.

DESCRIPTION OF EMBODIMENTS

Figure 1:
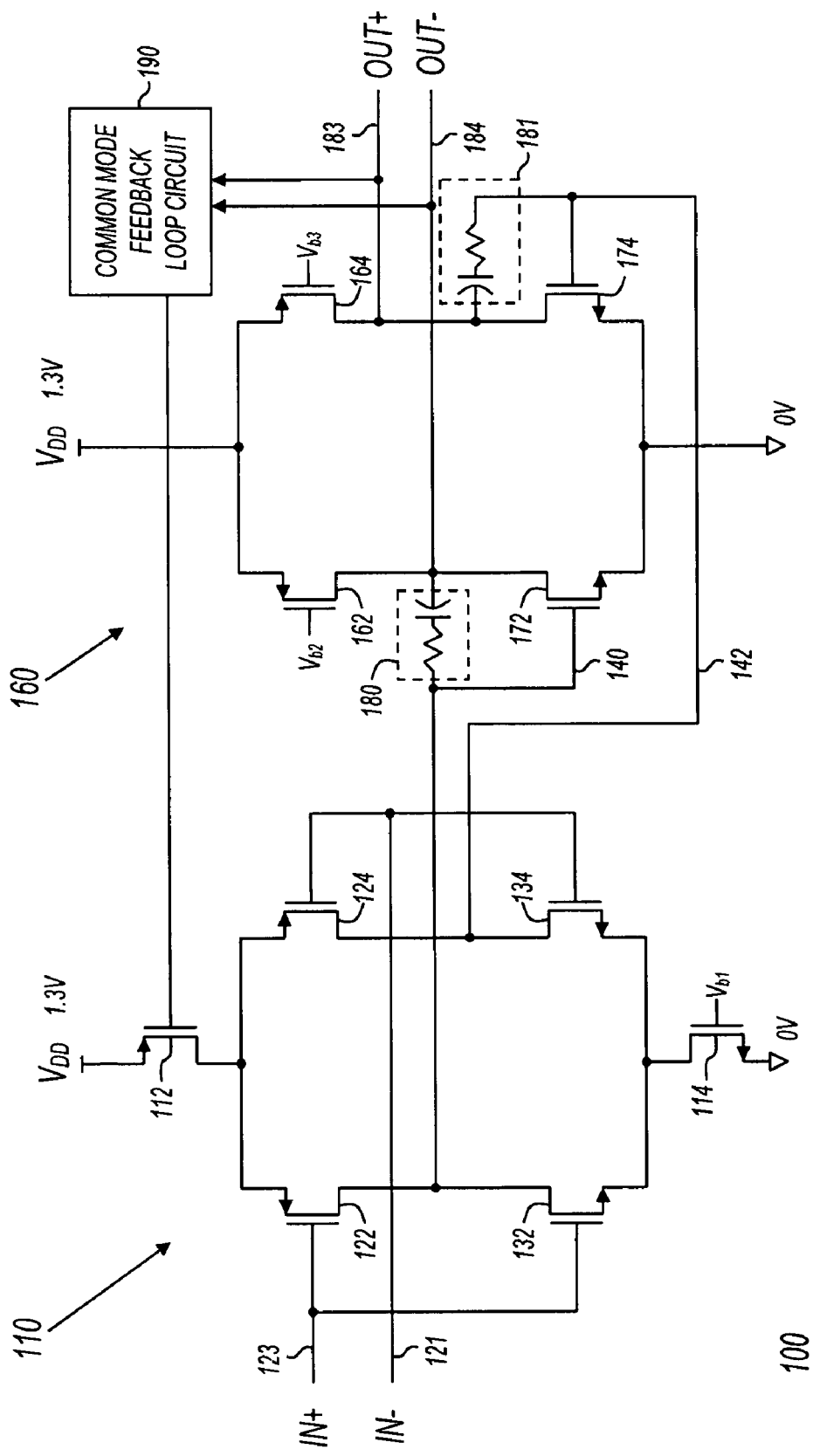
FIGS. 1 and 2 show amplifier circuits in accordance with various embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows an amplifier circuit in accordance with various embodiments of the present invention. Amplifier circuit 100 includes first stage 110 and second stage 160. First stage 110 includes transistors 112, 114, 122, 124, 132, and 134. Second stage 160 includes transistors 162, 164, 172, and 174, compensation networks 180 and 181, and common mode feedback loop circuit 190.

Transistors 122 and 124 form a first differential pair of transistors and transistors 132 and 134 form a second differential pair of transistors. As shown in FIG. 1, the two differential transistor pairs are complementary. The first differential pair (122, 124) is formed with p-channel metal oxide semiconductor field effect transistors (PMOSFETs), and the second differential pair (132, 134) is formed with n-channel metal oxide semiconductor transistors (NMOSFETs). The first and second differential pairs of transistors have drain nodes coupled to form a differential output of the first stage at nodes 140 and 142.

Current source transistor 112 is coupled between the first differential pair of transistors and an upper power supply node ($V_{DD}$), and current source transistor 114 is coupled between the second differential pair of transistors and a lower power supply node (GND). Current source transistors 112 and 114 provide current to flow through the first and second differential pairs of transistors in first stage 110. Current source transistor 112 is shown being controlled by common mode feedback loop circuit 190, and current source transistor 114 is shown having a gate node biased by voltage $V_{b1}$. $V_{b1}$ may be generated using any suitable means. For example, $V_{b1}$ may be generated by current mirror circuits. Circuit 190 detects the common mode voltage on differential amplifier output nodes 183 and 184, and modifies the bias voltage on the gate node of transistor 112.

In some embodiments, transistor 114 is biased by a common mode feedback loop circuit, and transistors 112 is biased by a current mirror circuit. In other embodiments, both transistors 112 and 114 are biased using common mode feedback loop circuits.

First stage 110 receives a differential input signal (IN+, IN−) on differential amplifier input nodes 123 and 121. Input node 123 is coupled to the gate nodes of transistors 122 and 132, and input node 121 is coupled to the gate nodes of transistors 124 and 134. As the differential voltage on input nodes 123 and 121 varies, an amplified differential voltage is presented to second stage 160 on nodes 140 and 142.

The complementary differential pairs of transistors in first stage 110 provide high transconductance with good (low) noise performance. In some embodiments, transistors 122, 124, 132, and 134 have large width-to-length (W/L) ratios. For example, transistors widths may be on the order of 2000 u (microns), and transistor lengths may be on the order of 0.24 u. These transistor sizes are provided as examples, and the various embodiments of the invention are not so limited.

Second stage 160 includes common source transistors 172 and 174. Transistors 172 and 174 have gate nodes coupled to receive an input voltage for the second stage on nodes 140 and 142, and have source nodes coupled to a lower power supply node (GND). Accordingly, for proper operation, the common mode voltage on nodes 140 and 142 is substantially equal to the gate-to-source voltage of an NMOS transistor when operating in saturation. This may vary based on transistor size, doping levels, and other process dependencies, but in some embodiments may be around 0.45 Volts. In these embodiments, the input common mode voltage on differential amplifier input nodes 123 and 121 is also around 0.45 Volts. Feedback circuits to set the input common mode voltage are described further below with reference to FIG. 2.

Second stage 160 also includes load transistors 162 and 164. Load transistors 162 and 164 are shown having gate nodes biased by bias voltages $V_{b2}$ and $V_{b3}$. $V_{b2}$ and $V_{b3}$ may be generated using any suitable means. For example, $V_{b2}$ and $V_{b3}$ may be generated by current mirror circuits. In some embodiments, the common mode output voltage is substantially $V_{DD}/2$.

When the common mode output voltage is set to substantially half way between the voltages on the upper and lower power supply nodes, the second stage may have a large output swing. For example, in some embodiments, $V_{DD}$ may be substantially 1.3V, and the lower supply voltage may be 0V. In these embodiments, common mode feedback loop circuit 190 may set the bias points of transistors 162 and 164 to set the common mode output voltage to substantially 0.65V. The voltages on output nodes 183 and 184 may be able to come within about 100 mV of either $V_{DD}$ or the lower power supply node, so when biased properly, amplifier stage 160 may have an output voltage swing from about 100 mV to about 1.2 V.

The combination of first stage 110 and second stage 160 provides good noise performance (from first stage 110) and a large output voltage swing (from second stage 160). In some embodiments, the voltage on output nodes 183 and 184 may be fed back to input nodes 121 and 123, respectively, to set the gain and/or bandwidth of the resulting amplifier. Because the output common mode voltage is substantially $V_{DD}/2$, and the input common mode voltage is something other than $V_{DD}/2$ to allow proper operation of transistors 122, 124, 132, and 134 in saturation, the various embodiments of the present invention utilize level shifting feedback networks. Example level shifting feedback networks are described with reference to FIG. 2.

Figure 2:
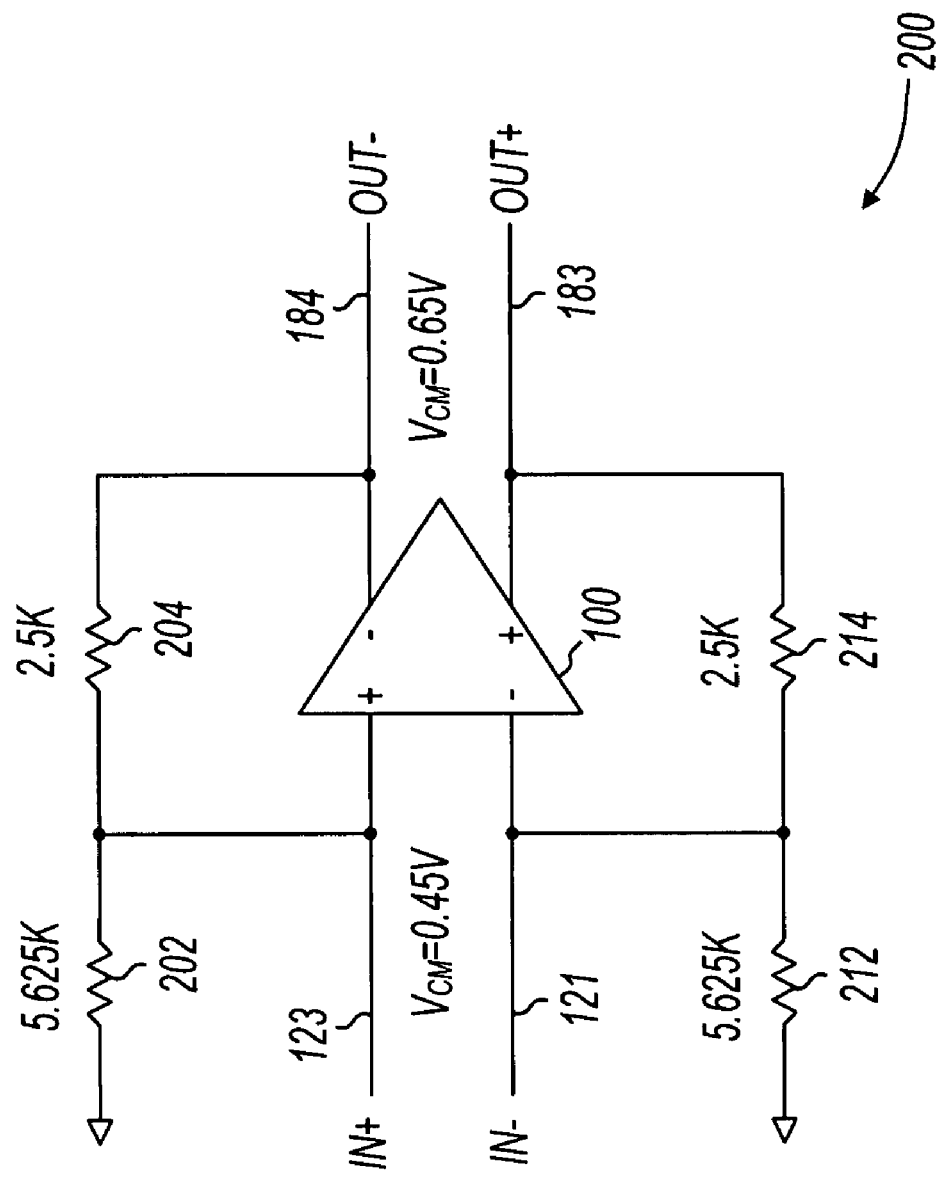

FIG. 2 shows an amplifier circuit in accordance with various embodiments of the present invention. Circuit 200 includes amplifier circuit 100 and a feedback network that includes resistors 202, 204, 212, and 214. In operation, resistors 204 and 202 form a voltage divider to provide a DC bias of 0.45V to node 123 when output node 184 has a DC bias of 0.65V. Similarly, resistors 212 and 214 form a voltage divider to provide a DC bias of 0.45V to node 121 when output node 183 has a DC bias of 0.65V. As described above with reference to FIG. 1, biasing the input common mode voltage on node 123 and 121 to a value other than $V_{DD}/2$ allows the two differential pair of transistors (122, 124, 132, 134) in the first stage to operate in saturation.

Figure 3:
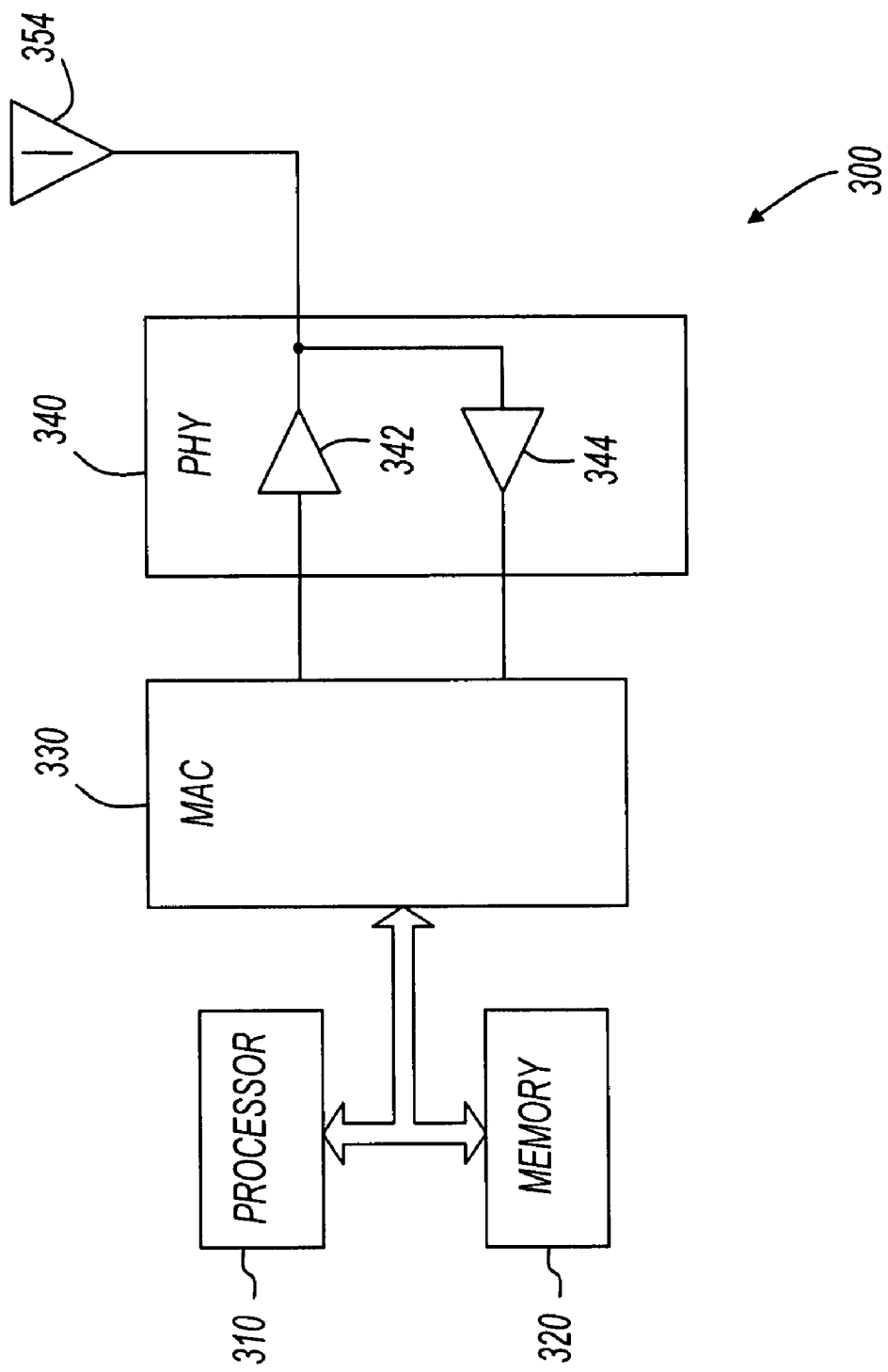
FIG. 3 shows a diagram of an electronic system in accordance with various embodiments of the present invention.

FIG. 3 shows a system diagram in accordance with various embodiments of the present invention. Electronic system 300 includes antenna 354, physical layer (PHY) 340, media access control (MAC) layer 330, processor 310, and memory 320. In operation, system 300 sends and receives signals using antenna 354, and the signals are processed by the various elements shown in FIG. 3.

Antenna 354 may include one or more antennas. For example, antenna 354 may include a single directional antenna or an omni-directional antenna. As used herein, the term omni-directional antenna refers to any antenna having a substantially uniform pattern in at least one plane. For example, in some embodiments, antenna 354 may include a single omni-directional antenna such as a dipole antenna, or a quarter wave antenna. Also for example, in some embodiments, antenna 354 may include a single directional antenna such as a parabolic dish antenna or a Yagi antenna. In still further embodiments, antenna 354 may include multiple physical antennas. For example, in some embodiments, multiple antennas are utilized for multiple-input-multiple-output (MIMO) processing or spatial-division multiple access (SDMA) processing.

Physical layer (PHY) 340 is coupled to antenna 354 to interact with other wireless devices. PHY 340 may include circuitry to support the transmission and reception of radio frequency (RF) signals. For example, as shown in FIG. 3, PHY 340 includes power amplifier (PA) 342 and low noise amplifier (LNA) 344. Power amplifier 342 may include an amplifier such as those described above with reference to FIGS. 1 and 2. In some embodiments, PHY 340 includes additional functional blocks to perform filtering, frequency conversion or the like.

PHY 340 may be adapted to transmit/receive and modulate/demodulate signals of various formats and at various frequencies. For example, PHY 340 may be adapted to receive time division multiple access (TDMA) signals, code division multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The various embodiments of the present invention are not limited in this regard.

Example systems represented by FIG. 3 include cellular phones, personal digital assistants, wireless local area network interfaces, wireless wide area network stations and subscriber units, and the like. Many other systems uses for power amplifiers exist. For example, PA 342 may be used in a desktop computer, a network bridge or router, or any other system without an antenna.

Media access control (MAC) layer 330 may be any suitable media access control layer implementation. For example, MAC 330 may be implemented in software, or hardware or any combination thereof. In some embodiments, a portion of MAC 330 may be implemented in hardware, and a portion may be implemented in software that is executed by processor 310. Further, MAC 330 may include a processor separate from processor 310.

Processor 310 may be any type of processor capable of communicating with memory 320, MAC 330, and other functional blocks (not shown). For example, processor 310 may be a microprocessor, digital signal processor (DSP), microcontroller, or the like.

Memory 320 represents an article that includes a machine readable medium. For example, memory 320 represents a random access memory (RAM), dynamic random access memory (DRAM), static random access memory (SRAM), read only memory (ROM), flash memory, or any other type of article that includes a medium readable by processor 310. Memory 320 may store instructions for performing software driven tasks. Memory 320 may also store data associated with the operation of system 300.

Although the various elements of system 300 are shown separate in FIG. 3, embodiments exist that combine the circuitry of processor 310, memory 320, MAC 330, and all or a portion of PHY 340 in a single integrated circuit. For example, MAC 330 and PA 342 may be combined together on an integrated circuit die. In some embodiments, the various elements of system 300 may be separately packaged and mounted on a common circuit board. In other embodiments, the various elements are separate integrated circuit dice packaged together, such as in a multi-chip module, and in still further embodiments, various elements are on the same integrated circuit die.

Amplifier circuits, bias circuits, feedback circuits, and other embodiments of the present invention can be implemented in many ways. In some embodiments, they are implemented in integrated circuits as part of electronic systems. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, portions of amplifier circuit 100 (FIG. 1) may be represented as polygons assigned to layers of an integrated circuit.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An amplifier circuit comprising:
   differential amplifier input nodes and differential amplifier output nodes;
   a first stage including a first differential pair of transistors, and a second differential pair of transistors of a type complementary to the first differential transistors, the first and second differential pairs of transistors having gates coupled to be driven by the differential amplifier input nodes and drains coupled to drive differential first stage output nodes;
   a second stage including a pair of common source transistors having gates coupled to the differential first stage output nodes and drains coupled to the differential amplifier output nodes; and
   a level shifting feedback network coupled between the differential amplifier input nodes and the differential amplifier output nodes to establish different common mode voltages on the differential amplifier input nodes and the differential amplifier output nodes.

2. The amplifier circuit of claim 1 wherein the pair of common source transistors in the second stage are NMOS transistors having source nodes coupled to a lower power supply node.

3. The amplifier circuit of claim 2 wherein the level shifting feedback network includes resistors to reduce the common mode voltage on the differential amplifier input nodes to a point at which a common mode voltage on the differential first stage output nodes is substantially equal to a saturated gate-to-source voltage for the NMOS transistors.

4. The amplifier circuit of claim 2 wherein the second stage includes load transistors coupled between the pair of common source transistors and an upper power supply node.

5. The amplifier circuit of claim 1 further comprising a current source transistor coupled between an upper lower power supply node and the first differential pair of transistors in the first stage.

6. The amplifier circuit of claim 5 further comprising a common mode feedback loop coupled between the differential amplifier output nodes and a gate node of the current source transistor.

7. The amplifier circuit of claim 1 further comprising a current source transistor coupled between a lower power supply node and the second differential pair of transistors in the first stage.

8. An amplifier circuit comprising:
   a first stage having two complementary differential pairs of transistors coupled between upper and lower power supply nodes, a pair of differential first stage output nodes being formed at drain nodes of the two complementary differential pairs of transistors;
   a second stage having a pair of common source transistors having gates coupled to the pair of differential first stage output nodes and having sources coupled to the lower power supply node; and
   a feedback network coupled to set a common mode input voltage of the first stage to a voltage other than halfway between voltages on the upper and lower power supply nodes.

9. The amplifier circuit of claim 8 wherein the second stage includes load transistors coupled between the differential pair of transistors and the upper power supply node.

10. The amplifier circuit of claim 8 wherein the feedback network comprises resistive voltage dividers coupled between output nodes of the second stage and input nodes of the input stage.

11. The amplifier circuit of claim 8 further comprising a current source transistor coupled between the two complementary differential pairs of transistors and the upper power supply node.

12. The amplifier circuit of claim 8 further comprising a current source transistor coupled between the two complementary differential pairs of transistors and the lower power supply node.

* * * * *